(12) United States Patent
Watson

(10) Patent No.: US 9,298,077 B2
(45) Date of Patent: Mar. 29, 2016

(54) REACTION ASSEMBLY FOR A STAGE ASSEMBLY

(71) Applicants: NIKON CORPORATION, Tokyo (JP); Lorri L. Watson, Campbell, CA (US)

(72) Inventor: Douglas C. Watson, Campbell, CA (US)

(73) Assignee: Nikon Corporation (JP)

( * ) Notice: Subject to any disclaimer, the term of this patent is extended or adjusted under 35 U.S.C. 154(b) by 566 days.

(21) Appl. No.: 13/645,794

(22) Filed: Oct. 5, 2012

(65) Prior Publication Data

US 2013/0088703 A1    Apr. 11, 2013

Related U.S. Application Data

(60) Provisional application No. 61/545,275, filed on Oct. 10, 2011.

(51) Int. Cl.
| | |
|---|---|
| B64C 17/06 | (2006.01) |
| G03B 27/32 | (2006.01) |
| G03B 27/58 | (2006.01) |
| G03B 27/62 | (2006.01) |
| H02K 41/02 | (2006.01) |
| G03F 7/20 | (2006.01) |

(52) U.S. Cl.
CPC ............ *G03B 27/58* (2013.01); *G03F 7/70716* (2013.01); *G03F 7/70766* (2013.01)

(58) Field of Classification Search
CPC . G03B 27/58; G03F 7/70716; G03F 7/70725; G03F 7/70766; G03F 7/709; H01L 21/68; H01L 21/682

USPC ................. 310/12.04, 12.05, 12.06; 318/649; 355/72, 75, 77
See application file for complete search history.

(56) References Cited

U.S. PATENT DOCUMENTS

| | | | |
|---|---|---|---|
| 6,593,997 B1 | 7/2003 | Watson | |
| 6,603,531 B1 | 8/2003 | Binnard | |
| 6,757,053 B1 | 6/2004 | Hazelton | |
| 6,927,838 B2 | 8/2005 | Ono | |
| 2002/0117109 A1 | 8/2002 | Hazelton | |
| 2003/0218732 A1 | 11/2003 | Watson | |
| 2009/0262325 A1 | 10/2009 | Butler et al. | |
| 2009/0316133 A1* | 12/2009 | Shibazaki | ..................... 355/72 |

* cited by examiner

*Primary Examiner* — Colin Kreutzer
(74) *Attorney, Agent, or Firm* — Roeder & Broder LLP; Steven G. Roeder

(57) ABSTRACT

A reaction assembly 18 for a stage assembly 10 that moves a device 26 along a first axis includes a base countermass 40 and a first transverse countermass 42. The stage assembly 10 includes a stage 14 and a stage mover 16 that includes a moving component 38 that is coupled to the stage 14 and a reaction component 36 that is secured to the base countermass 40. The first transverse countermass 42 is guided to allow for movement along a first transverse axis 50 and the first transverse countermass 42 is coupled to the base countermass 40 so that movement of the base countermass 40 along the first axis causes the first transverse countermass 42 to move along the first transverse axis 50.

24 Claims, 7 Drawing Sheets

REACTION ASSEMBLY FOR A STAGE ASSEMBLY

RELATED APPLICATIONS

The application claims priority on U.S. Provisional Application Ser. No. 61/545,275 filed on Oct. 10, 2011, entitled "REACTION ASSEMBLY FOR A STAGE ASSEMBLY". As far as is permitted, the contents of U.S. Provisional Application Ser. No. 61/545,275 are incorporated herein by reference.

BACKGROUND

Exposure apparatuses are commonly used to transfer images from a reticle onto a semiconductor wafer during semiconductor processing. A typical exposure apparatus includes an illumination source, a reticle stage assembly that retains a reticle, a lens assembly and a wafer stage assembly that retains a semiconductor wafer.

Typically, the wafer stage assembly includes a wafer stage base, a wafer stage that retains the wafer, and a wafer stage mover assembly that precisely positions the wafer stage and the wafer. Somewhat similarly, the reticle stage assembly includes a reticle stage base, a reticle stage that retains the reticle, and a reticle stage mover assembly that precisely positions the reticle stage and the reticle. The size of the images and the features within the images transferred onto the wafer from the reticle are extremely small. Accordingly, the precise relative positioning of the wafer and the reticle is critical to the manufacturing of high density, semiconductor wafers.

Unfortunately, the wafer stage mover assembly generates reaction forces that can vibrate the wafer stage base. Similarly, the reticle stage mover assembly generates reaction forces that can vibrate the reticle stage base. The vibration influences the position of the other components of the exposure apparatus. As a result thereof, the vibration can cause an alignment error between the reticle and the wafer. This reduces the accuracy of positioning of the wafer relative to the reticle, or some other reference, and degrades the accuracy of the exposure apparatus.

SUMMARY

The present invention is directed to a stage assembly that moves a device. The stage assembly includes a stage that retains the device, a stage mover that moves the stage along a first axis, and a reaction assembly. The stage mover includes a moving component that is coupled to the stage and a reaction component that is secured to the reaction assembly. In one embodiment, the reaction assembly includes a base countermass and a first transverse countermass. As provided herein, the base countermass is guided to allow for movement along the first axis, and the base countermass is coupled to the reaction component so that reaction forces from the stage mover are transferred to the base countermass to move the base countermass along the first axis. The first transverse countermass is guided to allow for movement along a first transverse axis that is transverse to the first axis. Further, the first transverse countermass is coupled to the base countermass so that movement of the base countermass along the first axis causes the first transverse countermass to move along the first transverse axis.

With this design, the reaction assembly counteracts the reaction forces generated by the stage mover. As a result thereof, the stage assembly can more accurately position the device. Further, the stage assembly can be used in an exposure apparatus to manufacture high density, high quality semiconductor wafers.

In certain embodiments, the reaction assembly also includes a first angled linear guide that guides the movement of the first transverse countermass relative to the base countermass so that horizontal motion of the base countermass passively drives the first transverse countermass to create vertical reaction forces that cancel pitching moments on the base countermass caused by the offset of the center of gravity of the stage assembly. Stated in a slightly different fashion, the first angled linear guide guides the movement of the first transverse countermass relative to the base countermass so that motion of the base countermass along the first axis passively drives the first transverse countermass along the first transverse axis to create a first transverse reaction force that counteracts pitching moments on the base countermass caused by offset of the center of gravity of the stage assembly.

Additionally, the reaction assembly can include a second transverse countermass that is guided to allow for movement along a second transverse axis that is transverse to the first axis, the second transverse countermass being coupled to the base countermass so that movement of the base countermass along the first axis causes the second transverse countermass to move along the second transverse axis.

Moreover, the reaction assembly can include a third transverse countermass that is guided to allow for movement along a third transverse axis that is transverse to the first axis, the third transverse countermass being coupled to the base countermass so that movement of the base countermass causes the third transverse countermass to move along the third transverse axis. For example, in this embodiment, movement of the base countermass along a second axis that is perpendicular to the first axis causes the third transverse countermass to move along the third transverse axis.

Additionally, the present invention is directed to a stage assembly for moving a device along a first axis. In one embodiment, the stage assembly includes (i) a stage that retains the device, (ii) a stage mover that moves the stage along the first axis, the stage mover including a moving component that is coupled to the stage and a reaction component, and (iii) the reaction assembly described above that is coupled to the reaction component. In this embodiment, when the stage mover moves the stage in a first direction along the first axis, the base countermass moves in a second direction that is opposite to the first direction along the first axis.

Further, in certain embodiments, movement of the base countermass in a first direction along the first axis causes the first transverse mass to move in a first direction along the first transverse axis, and movement of the base countermass in a second direction that is opposite the first direction along the first axis causes the first transverse mass to move in a second direction that is opposite the first direction along the first transverse axis.

In one embodiment, the stage assembly also includes a stage base that supports the base countermass, and a reaction bearing that allows the base countermass to move relative to the stage base along the first axis. In this embodiment, the stage assembly can include a trim mover that moves the base countermass relative to the stage base.

The present invention is also directed to an exposure apparatus, a device manufactured with the exposure apparatus, and/or a wafer on which an image has been formed by the exposure apparatus. Further, the present invention is also directed to a method for making a stage assembly, a method for making an exposure apparatus, a method for making a device and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1A:
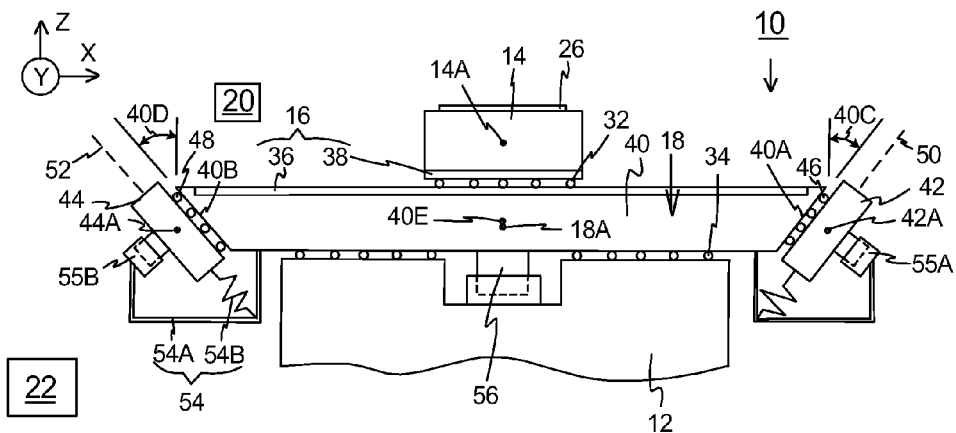
FIG. 1A is a side view of a first embodiment of a stage assembly having features of the present invention.
Figure 1B:
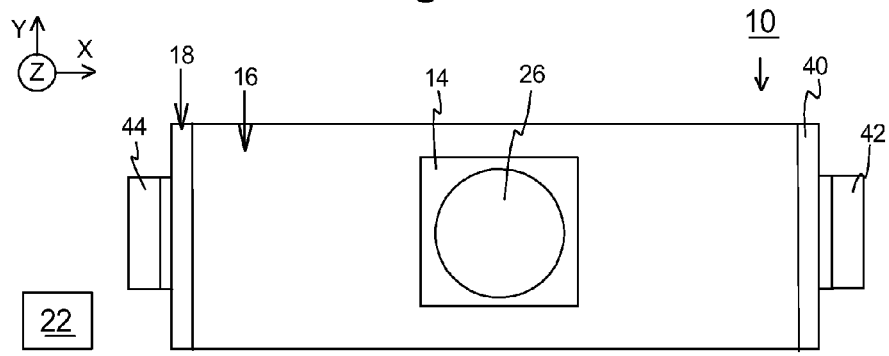
FIG. 1B is a top view of the stage assembly of FIG. 1A.

Referring initially to FIGS. 1A and 1B, a stage assembly 10 having features of the present invention includes a stage base 12, a stage 14, a stage mover 16, a reaction assembly 18, a measurement system 20 (illustrated as a box), and a control system 22 (illustrated as a box). The design of each of these components can be varied to suit the design requirements of the assembly 10. The stage assembly 10 is positioned above a mounting base 624 (illustrated in FIG. 6). The stage mover 16 precisely moves the stage 14 relative to the stage base 12. As an overview, the reaction assembly 18 counteracts, cancels out, reduces and minimizes the influence of the reaction forces from the stage mover 16 on the position of the stage base 12 and the mounting base 624. Further, the reaction assembly 18 compensates for torque generated by the stage mover 16 that results from a center of gravity ("CG") 14A of the stage 14 being positioned (at a different position along the Z axis from) above a center of gravity 18A of the reaction assembly 18.

The stage assembly 10 is particularly useful for precisely positioning a device 26 during a manufacturing and/or an inspection process. The type of device 26 positioned and moved by the stage assembly 10 can be varied. For example, the device 26 can be a semiconductor wafer, and the stage assembly 10 can be used as part of an exposure apparatus 630 (illustrated in FIG. 6) for precisely positioning the semiconductor wafer during manufacturing of the semiconductor wafer. Alternately, for example, the stage assembly 10 can be used to move a glass panel in an LCD lithography machine, to move other types of devices during manufacturing and/or inspection, to move a device under an electron microscope (not shown), or to move a device during a precision measurement operation (not shown).

Some of the Figures provided herein include an orientation system that designates an X axis, a Y axis, and a Z axis. It should be understood that the orientation system is merely for reference and can be varied. For example, the X axis can be switched with the Y axis and/or the stage assembly 10 can be rotated. Moreover, these axes can alternatively be referred to as a first, second, or third axis.

In the embodiments illustrated herein, the stage assembly 10 includes a single stage 14 that is moved relative to the stage base 12. Alternately, for example, the stage assembly 10 can be designed to include multiple stages that are independently moved relative to the stage base 12.

As an overview, in FIGS. 1A and 1B, the stage mover 16 is adapted to move the stage 14 a relatively large distance along the X axis, a short distance along the Y axis, and a small amount about the Z axis relative to the stage base 12. Further, the reaction assembly 18 inhibits the transfer of reaction forces to the stage base 12 and/or compensates for the torque generated by the stage mover 16. This minimizes the disturbance to and the distortion of the stage base 12 and improves the positioning performance of the stage assembly 10. Further, for an exposure apparatus 630, this allows for more accurate positioning of the semiconductor wafer and/or the reticle.

The stage base 12 supports a portion of the stage assembly 10 above the mounting base 624. In the embodiment illustrated herein, the stage base 12 is generally rectangular shaped.

The stage 14 retains the device 26. The stage 14 is precisely moved by the stage mover 16 to precisely position the device 26. In the embodiments illustrated herein, the stage 14 is generally rectangular shaped and includes a device holder (not shown) for retaining the device 26. The device holder can be a vacuum chuck, an electrostatic chuck, or some other type of clamp.

The stage 14 is maintained above the reaction assembly 18 with a stage bearing 32 (illustrated with small circles), e.g. a vacuum preload type fluid bearing. For example, the stage 14 can include a plurality of spaced apart fluid outlets (not shown), and a plurality of spaced apart fluid inlets (not shown). In this example, pressurized fluid (not shown) can be released from the fluid outlets towards the reaction assembly 18 and a vacuum can be pulled in the fluid inlets to create a vacuum preload type, fluid bearing between the stage 14 and the reaction assembly 18. In this embodiment, the bearing 32 allows for motion of the stage 14 relative to the reaction assembly 18 along the X axis, along the Y axis and about the Z axis relative to the stage base 12.

Alternatively, the stage 14 can be supported spaced apart from the reaction assembly 18 in other ways. For example, a magnetic type bearing (e.g. by levitation with the stage mover 16) or a roller bearing type assembly (not shown) could be utilized.

Somewhat similarly, the reaction assembly 18 is maintained above the stage base 12 with a reaction bearing 34 (illustrated with small circles), e.g. a vacuum preload type fluid bearing. For example, the stage base 12 can include a plurality of spaced apart fluid outlets (not shown), and a plurality of spaced apart fluid inlets (not shown). Pressurized fluid (not shown) is released from the fluid outlets towards the reaction assembly 18 and a vacuum is pulled in the fluid inlets to create a vacuum preload type, fluid bearing between the stage base 12 and the reaction assembly 18. In this embodiment, the bearing 34 allows for motion of the reaction assembly 18 relative to the stage base 12 along the X axis, along the Y axis and about the Z axis.

Alternatively, the reaction assembly 18 can be supported spaced apart from the stage base 12 in other ways. For example, a magnetic type bearing (not shown) or a roller bearing type assembly (not shown) could be utilized.

The stage mover 16 controls and adjusts the position of the stage 14 relative to the reaction assembly 18 and the stage base 12. For example, the stage mover 16 can include one or more linear or planar motors that move and position the stage 14 along the X axis, along the Y axis and about the Z axis ("three degrees of freedom" or "the planar degrees of freedom"). When the stage mover 16 applies a force to move the stage 14 (i) along the X axis, an equal and opposite reaction force is applied to the reaction assembly 18 along the X axis and a reaction torque is applied to the reaction assembly 18 about the Y axis; (ii) along the Y axis, an equal and opposite reaction force is applied to the reaction assembly 18 along the Y axis and a reaction torque is applied to the reaction assembly 18 about the X axis; and (iii) about the Z axis, an equal and opposite reaction torque is applied to the reaction assembly 18 about the Z axis.

Alternatively, the stage mover 16 can be designed to move the stage 14 with greater than or fewer than three degrees of freedom. For example, the stage mover 16 can be designed to move the stage 14 along the Z axis, about the X axis and about the Y axis in addition to the planar degrees of freedom.

In the embodiments provided herein, the stage mover 16 includes a reaction component 36 that is coupled to the reaction assembly 18, and an adjacent moving component 38 secured to the stage 14 that interacts with the reaction component 36. For example, the moving component 38 can include a conductor array and the reaction component 36 can include a magnet array. Alternatively, the moving component 38 can include the magnet array and the reaction component 36 can include the conductor array.

Each magnet array includes one or more magnets. The design of each magnet array and the number of magnets in each magnet array can be varied to suit the design requirements of the stage mover 16. Each magnet can be made of a permanent magnetic material such as NdFeB.

Each conductor array includes one or more conductors. The design of each conductor array and the number of conductors in each conductor array can be varied to suit the design requirements of the stage mover 16. Each conductor can be a coil that is made of metal such as copper or any substance or material responsive to electrical current and capable of creating a magnetic field such as superconductors.

Electrical current (not shown) is supplied to the conductors by the control system 22. The electrical current in the conductors interacts with the magnetic field(s) generated by the one or more magnets in the magnet array. This causes a force (Lorentz type force) between the conductors and the magnets that can be used to move the stage 14 relative to the stage base 12.

The reaction assembly 18 counteracts, cancels out, reduces and minimizes the influence of the reaction forces from the stage mover 16 on the position of the stage base 12 and the mounting base 24. Stated in another fashion, the reaction assembly 18 inhibits the transfer of reaction forces to the stage base 12. As provided above, the reaction component 36 of the stage mover 16 is coupled to the reaction assembly 18. With this design, the reaction forces generated by the stage mover 16 are transferred to the reaction assembly 18.

In one non-exclusive embodiment, the reaction assembly 18 includes a base countermass 40, a first transverse countermass 42, and a second transverse countermass 44, a first transverse guide 46 (illustrated as small circles), and a second transverse guide 48 (illustrated as small circles). As an overview, through the principle of conservation of momentum, (i) producing force on the stage 14 with the stage mover 16 along the X axis in a first X direction, generates an equal but opposite X reaction force that moves the base countermass 40 in a second X direction that is opposite the first X direction along the X axis; (ii) producing force on the stage 14 with the stage mover 16 along the Y axis in a first Y direction, generates an equal but opposite Y reaction force that moves the base countermass 40 in a second Y direction that is opposite the first Y direction along the Y axis; and (iii) movement of the stage 14 with the stage mover 16 about the Z axis in a first theta Z (rotational) direction, generates an equal but opposite theta Z reaction force (torque) that moves the base countermass 40 in a second theta Z (rotational) direction that is opposite the first theta Z direction about the Z axis.

In the embodiment illustrated in FIGS. 1A and 1B, the stage 14 is located above the stage mover 16 and the reaction assembly 18. Because the center of gravity 14A of the stage 14 is located above the center of gravity 18A of the reaction assembly 18, there is a pitching moment generated by the stage mover 16 on the reaction assembly 18 during acceleration of the stage 14 and the base countermass 40 with the stage mover 16. Without the unique design provided herein, these pitching moments can either cause undesirable rotation of the reaction assembly 18 or transfer directly to the stage base 12 and the mounting base 624, or both, depending on how the reaction assembly 18 is supported and constrained. These disturbance forces can negatively impact the system accuracy.

In certain embodiments, the base countermass 40 is free to move along the X axis, along the Y axis, and/or about the Z axis (θz) relative to the stage base 12. In one non-exclusive embodiment, the base countermass 40 is generally rectangular shaped and includes a first side 40A (on the right) and a second side 40B (on the left). Further, in one embodiment, the first side 40A is at a first angle 40C relative to the Z axis, and the second side 40B is at a second angle 40D relative to the Z axis. The size of the first angle 40C, and the second angle 40D can be varied pursuant to the teachings provided herein. Further, the absolute value of the first angle 40C can be the same or different to the second angle 40D. In alternative, non-exclusive embodiments, the first angle 40C and/or the second angle 40D has an absolute value of approximately 20, 25, 30, 35, 40, 45, 50, 55, 60, 65, or 70 degrees. However, other angles 40C, 40D can be utilized.

A center of gravity 40E of the base countermass 40 is also illustrated in FIG. 1A. In this embodiment of the stage assembly 10, the center of gravity 40E of the base countermass 40 is positioned below (at a different position along the Z axis from) the center of gravity 14A of the stage 14. As a result thereof, movement of the stage 14 with the stage mover 16 will generate a torque on the base countermass 40. For example, if the stage 14 is accelerated along the X axis, the stage mover 16 will generate a torque about the Y axis on the base countermass 40. Alternatively, if the stage 14 is accelerated along the Y axis, the stage mover 16 will generate a torque about the X axis on the base countermass 40.

Further, (i) the first transverse countermass 42 is attached to the first side 40A with the first transverse guide 46 that guides the movement of the first transverse countermass 42 (up and down) along a first transverse axis 50 that is substantially parallel to the first angle 40C relative to the Z axis (and transverse to the X and Z axes); and (i) the second transverse countermass 44 is attached to the second side 40B with the second transverse guide 48 that guides the movement of the second transverse countermass 44 (up and down) along a second transverse axis 52 that is substantially parallel to the second angle 40D relative to the Z axis (and transverse to the X and Z axes). In this embodiment, the first transverse axis 50 and the second transverse axis 52 have components along both the X and Z axes.

In the embodiment illustrated in FIGS. 1A and 1B, each transverse countermass 42, 44 acts as an anti-torque countermass that counteracts and reduces the potentially large pitching moments on the reaction assembly 18 caused by the center of gravity 14A of the stage 14 being offset and above the center of gravity 18A of the reaction assembly 18.

The design of the countermasses 40, 42, 44 can be varied to suit the design requirements of the reaction assembly 18. In certain embodiments, the ratio of the mass of the countermasses 40, 42, 44 to the mass of the stage 14 is relatively high. This will minimize the movement of the countermasses 40, 42, 44 and minimize the required travel of the countermasses 40, 42, 44. A suitable ratio of the mass of the countermasses 40, 42, 44 to the mass of the stage 14 is between approximately 2:1 and 20:1. A larger mass ratio is generally preferable, but is typically limited by the physical size of the reaction assembly 18.

In the embodiment illustrated in the Figures, each of the countermasses 40, 42, 44 is somewhat rectangular shaped, and the base countermass 40 is much larger and greater in mass than the transverse countermasses 42, 44. Further, the center of gravity 40E of the base countermass 40, a center of gravity 42A of the first transverse countermass 42, and a center of gravity 44A of the second transverse countermass 44 are also illustrated in FIG. 1A. It should be noted that the location of the center of gravity of the reaction assembly 18 will vary in the X and Y directions as the stage 14 moves in the X and Y directions. In certain embodiments, the location of the center of gravity 18A of the reaction assembly 18 will maintain a substantially constant position relative to the Z axis as the transverse countermasses 42, 44 are moved relative to the base countermass 40 in equal distances in opposite directions relative to the Z axis.

The design of the transverse guides 46, 48 can be varied. For example, one or both of the transverse guides 46, 48 can be an air bearing that functions as a linear guide that has desirable stiffness and damping perpendicular to the transverse axis 50, 52, and low (substantially zero in certain embodiments) friction along the transverse axis 50, 52. Alternatively, one or both of the transverse guides 46, 48 can be another type of linear guide, such as a roller bearing or ball bearing, etc. As a non-exclusive example, each transverse guide 46, 48 can be a linear guide.

In one embodiment, each of the transverse countermasses 42, 44 can be supported against gravity by a mass support 54. As a non-exclusive example, each mass support 54 can include (i) a rigid support beam 54A that is secured to and that cantilevers away from a bottom of the base countermass 40, and (ii) a resilient member 54B (such as a low-stiffness spring) that extends between the rigid support beam 54A and the bottom one of the transverse countermasses 42, 44.

Further, (i) the first transverse countermass 42 can include a first trim mover 55A that can be controlled with the control system 22 to move and position the first transverse countermass 42 into the proper position along the first transverse axis 50 to follow the optimal trajectory regardless of disturbance forces due to cables, friction, etc., and/or (ii) the second transverse countermass 44 can include a second trim mover 55B that can be controlled with the control system 22 to move and position the second transverse countermass 44 into the proper position along the second transverse axis 52 to follow the optimal trajectory regardless of disturbance forces due to cables, friction, etc. In this embodiment, each trim mover 55A, 55B can be coupled to the base countermass 40 with the support beam 54A or another rigid structure. Additionally, a base trim mover 56 can be used to adjust the position of the base countermass 40 relative to the stage base 12. For example, each trim movers 55A, 55B, 56 can include one or more rotary motors, voice coil motors, linear motors, electromagnetic actuators, other type of actuators, or a passive device such as a mechanical spring.

As provided herein, the problem of high pitching moments on the reaction assembly 18 caused by the center of gravity 14A of the stage 14 being offset from the center of gravity 18A of the reaction assembly 18 is solved by attaching the transverse countermasses 42, 44 to the base (main) countermass 40 with angled linear guides 46, 48. With this design, the transverse countermasses 42, 44 are passively driven by the horizontal motion of the main countermass 40 to create vertical reaction forces that reduce and cancel the pitching moments.

Figure 1C:
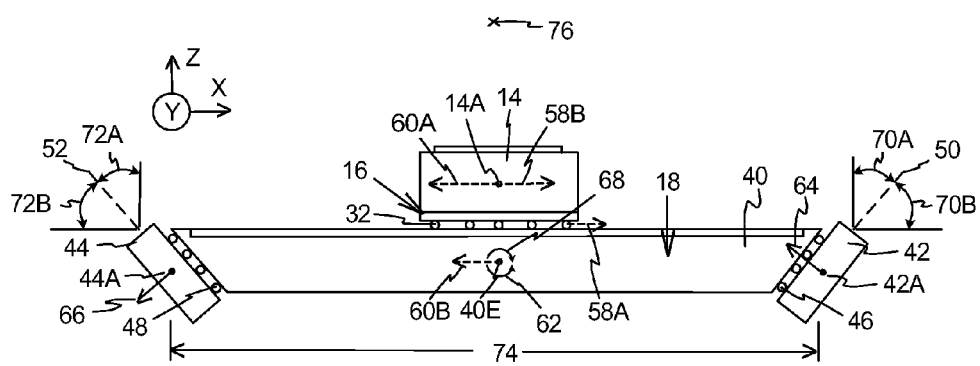
FIG. 1C is a simplified side illustration of a portion of the stage assembly of FIG. 1A including forces applied to the components for one movement.

FIG. 1C is a simplified illustration that illustrates the motion of the base countermass 40 and the two transverse countermasses 42, 44 when it is desired to accelerate the stage 14 to the right (in the first X direction) along the X axis without allowing any rotation of the stage 14 or the base countermass 40. The forces applied to the components are illustrated with arrows. In this example, to move the stage 14 along the X axis in the first X direction, the stage mover 16 applies a stage force 58A to the stage 14 that is in the first X direction. Because the center of gravity 14A of the stage 14 is above stage mover 16, the stage force 58A would also create a pitching moment (not shown) about the Y axis on stage 14. This undesired pitching moment is canceled by vertical forces within the bearing 32 or by stage mover 16. The net force 58B acting on the stage 14 acts through the stage center of gravity 14A. Reaction forces and moments to the components of stage net force 58B all act on the base countermass 40 and create an equal and opposite net reaction force 60A in the opposite second X direction along the X axis to the base countermass 40. The reaction force 60A applied to the base countermass 40 drives the base countermass 40 to the left along the second X direction.

Further, because the net reaction force 60A acts in the X direction through the center of gravity 14A of the stage 14, which is above the center of gravity 40E of the base countermass 40, the net reaction force 60A generated by the stage mover 16 and the bearing 32 will tend to rotate the base countermass 40 about the Y axis. Stated another way, the reactions caused by driving stage 14 with net force 58A will create both (i) a reaction force 60B (acting through the center of gravity 40E of base countermass 40) and (ii) a reaction torque 62 about the Y axis in a first thetaY direction (e.g. the counter-clockwise direction in FIG. 1C) on the base countermass 40.

With the unique design provided herein, the movement of the base countermass 40 to the left creates (i) a first countermass force 64 (directed upward and to the left (perpendicular to the first transverse axis 50)) transmitted through the first transverse guide 46 to the first countermass 42, and (ii) a second countermass force 66 (directed downward and to the left (perpendicular to the second transverse axis 52)) transmitted through the second transverse guide 48 to the second countermass 44. In this example, (i) the first countermass force 64 drives the first transverse countermass 42 to the left and upward perpendicular to the first transverse axis 50 relative to the fixed ground, and upward and to the right along the first transverse axis 50 relative to the base countermass 40, and (ii) the second countermass force 66 drives the second transverse countermass 44 to the left and downward perpendicular to the second transverse axis 52 relative to the fixed ground, and to the right and downward along the second transverse axis 52 relative to the base countermass 40. Stated in another fashion, movement of the base countermass 40 to the left will cause the first transverse countermass 42 to move in the generally upward direction along the first transverse axis 50, and the second transverse countermass 44 to move in the generally downward direction along the second transverse axis 52. In contrast, movement of the base countermass 40 to the right will cause the first transverse countermass 42 to move in the generally downward direction along the first transverse axis 50, and the second transverse countermass 44 to move in the generally upward direction along the second transverse axis 52. The reactions from the forces 64, 66 act in the opposite directions perpendicular to axes 50, 52, and create a counter-torque 68 about the Y axis in a second theta Y direction (e.g. the clockwise direction in FIG. 1C) on base countermass 40.

In this way, with the unique design provided herein, reactions from (i) the first countermass force 64 applied to the first transverse countermass 42, and (ii) the second countermass force 66 applied to the second first transverse countermass 44 will create a counter-torque 68 on the base countermass 40 that counters (is in the opposite direction to) the reaction torque 62 generated by the stage mover 16 and/or the bearing 32. As a result thereof, the summation of the torque applied to the base countermass 40 is less than the reaction torque 62, and less overall torque is transferred to the stage base 12. Stated in another fashion, the vertical components of the countermass forces 64, 66 on the transverse countermasses 42, 44 create a pitching moment 68 that counters the pitching moment 62 from the stage 14 and substantially avoids any rotation of the base countermass 40 or disturbance to the stage base 12.

In the example illustrated in FIG. 1C, (i) the stage force 58A generated by the stage mover 16 and bearing 32 will generate the reaction torque 62 about the Y axis in the first theta Y direction (e.g. the counter-clockwise direction in FIG. 1C) on the base countermass 40, and (ii) reactions from the resulting countermass forces 64, 66 will create the counter-torque 68 about the Y axis in a second theta Y direction (e.g. the clockwise direction in FIG. 1C) on the base countermass 40 that reduces the net torque about the Y axis on the reaction base 40. Alternatively, if the stage force 58 is in the second X direction (e.g. towards the left in FIG. 1C), (i) the stage force 58 generated by the stage mover 16 will generate the reaction torque 62 about the Y axis in the second theta Y direction (e.g. the clockwise direction) on the base countermass 40, and (ii) the resulting countermass forces 64, 66 will create the counter-torque 68 about the Y axis in the first theta Y direction (e.g. the counter-clockwise direction) on the base countermass 40 that reduces the net torque 62 about the Y axis on the base countermass 40. Stated in another fashion, the anti-symmetric motion of the first and second countermasses 42, 44 creates the counter-torque 68 to reduce or cancel reaction torque 62 acting on the base countermass 40.

In alternative, non-exclusive embodiments, depending upon the design of the reaction assembly 18, the absolute value of the counter-torque 68 (generated by reactions to the forces 64, 66 applied to the countermasses 42, 44) is at least approximately 20, 30, 40, 45, 50, 55, 60, 65, 70, 75, 80, 85, 90, 95, or 100 percent of the absolute value of the reaction torque 62 (generated by the force 58 applied to the stage 14). As a result thereof, the resulting net torque is reduced by at least approximately 20, 30, 40, 45, 50, 55, 60, 65, 70, 75, 80, 85, 90, 95, or 100 percent.

In FIG. 1C, (i) the first transverse axis 50 is at a first Z angle 70A relative to the Z axis and at a first X angle 70B relative to the X axis; and (ii) the second transverse axis 52 is at a second Z angle 72A relative to the Z axis and at a second X angle 72B relative to the X axis one embodiment. Further, (i) the first Z angle 70A plus the first X angle 70B is equal to ninety degrees; and (ii) the second Z angle 72A plus the second X angle 72B is equal to ninety degrees.

Moreover, the size of the first Z angle 70A, and the second Z angle 72A can be varied pursuant to the teachings provided herein. Further, the absolute value of the first Z angle 70A can be the same or different to the second Z angle 72A. In alternative, non-exclusive embodiments, the first Z angle 70A and/or the second Z angle 72A has an absolute value of approximately 20, 25, 30, 35, 40, 45, 50, 55, 60, 65, or 70 degrees. However, other Z angles 70A, 72A can be utilized.

In certain embodiments, the center of gravity 42A of the first transverse countermass 42 and the center of gravity 44A of the second transverse countermass 44 can be spaced apart along the X axis a separation distance 74. In certain embodiments, the reaction assembly 18 is designed so that the Z angles 70A, 72A of the transverse axes 50, 52 and the separation distance 74 as such that a line (not shown) that extends from the center of gravity 42A of the first transverse countermass 42 normal to the first transverse guide 46 (and the first transverse axis 50) and a line (not shown) that extends from the center of gravity 44A of the second transverse countermass 44 normal to the second transverse guide 48 (and the second transverse axis 52) intersect at an intersection point 76 that is equal to or above the center of gravity 14A of the stage 14. This intersection point 76 can be viewed as a "virtual center of gravity countermass point". By tuning the Z angles 70A, 72A, the masses of the components 18, 40, 42, 44 of the reaction assembly 18, and the distance 74, an effective, virtual center of gravity countermass point can be created at any desired Z location, including in the plane of the center of gravity 14A of stage 14. When the virtual countermass point 76 is located at the same Z location as the stage center of gravity 14A (and thereby the same Z location as net force 58 and net reaction force 60), there are substantially no pitching moments or vertical disturbances transmitted to the stage base 12 or other parts of the system.

The configuration illustrated in FIGS. 1A-1C can be applied to stages with long travel in only one axis (e.g., a reticle stage). The concepts provided herein can also be applied to a planar motor stage with long travel in two directions as described in more detail below.

Further, in certain embodiments of the present design, the reaction assembly 18 effectively inhibits the transfer of reaction forces to the stage base 12 even though the center of gravity 18A of the reaction assembly 18 is positioned below the stage 14, and the countermass 40, 42, 44 have not been raised to move the center of gravity 18A of the reaction assembly 18 upward. With certain embodiments, the center of gravity 18A of the reaction assembly 18 is not in the same plane as (and is below) the center of gravity 14A of the stage 14. The raising of the center of gravity of the reaction assembly 18 typically requires adding extra masses on tall supports to the countermass, which requires extra height which may not be available without interference with the projection lens, metrology system, or other components of the exposure apparatus 630.

Figure 6:
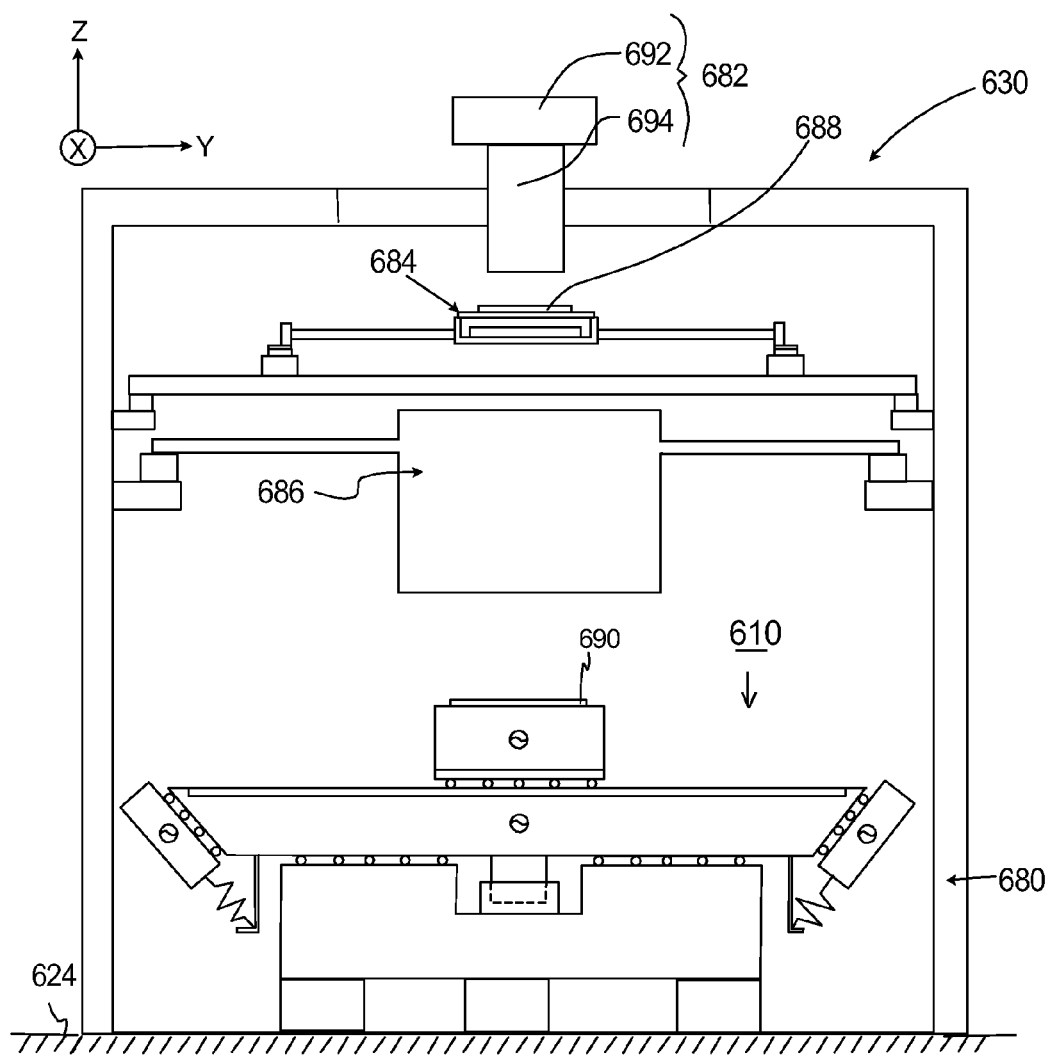
FIG. 6 is a schematic illustration of an exposure apparatus having features of the present invention.

Referring back to FIG. 1A, the measurement system 20 monitors movement of the stage 14 relative to the stage base 12, or to some other reference such as an optical assembly (illustrated in FIG. 6). With this information, the stage mover 16 can be controlled to precisely position the stage 14. Further, the measurement system 20 can monitor movement or the position of the countermasses 40, 42, 44. With this information, the trim movers 56, 55A, 55B can be controlled to correct the position of the respective countermasses 40, 42, 44. For example, the measurement system 20 can utilize laser interferometers, encoders, and/or other measuring devices.

In the embodiment illustrated in FIG. 1A, the control system 22 controls the stage mover 16 to precisely position the stage 14 and the device 26. Additionally, the control system 22 can direct and control current to the trim movers 55A, 55B, 56 to control the position of the reaction assembly 18. The control system 22 can include one or more processors.

Figure 2A:
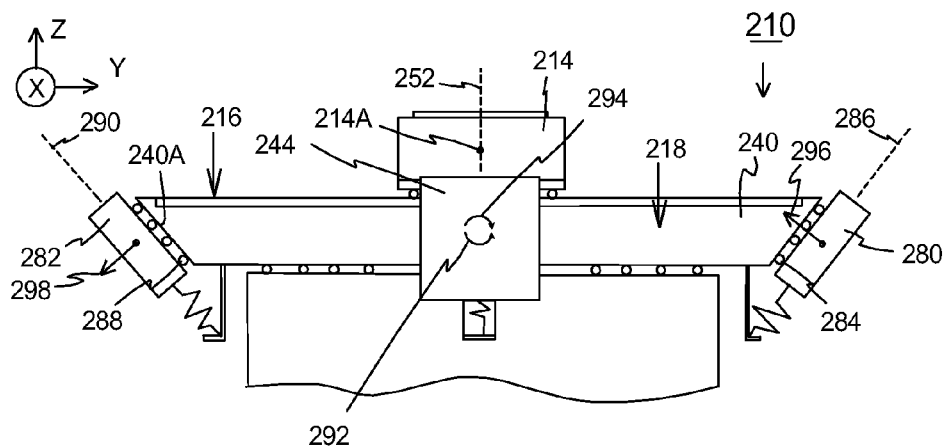
FIG. 2A is a side view of another embodiment of a stage assembly having features of the present invention.
Figure 2B:
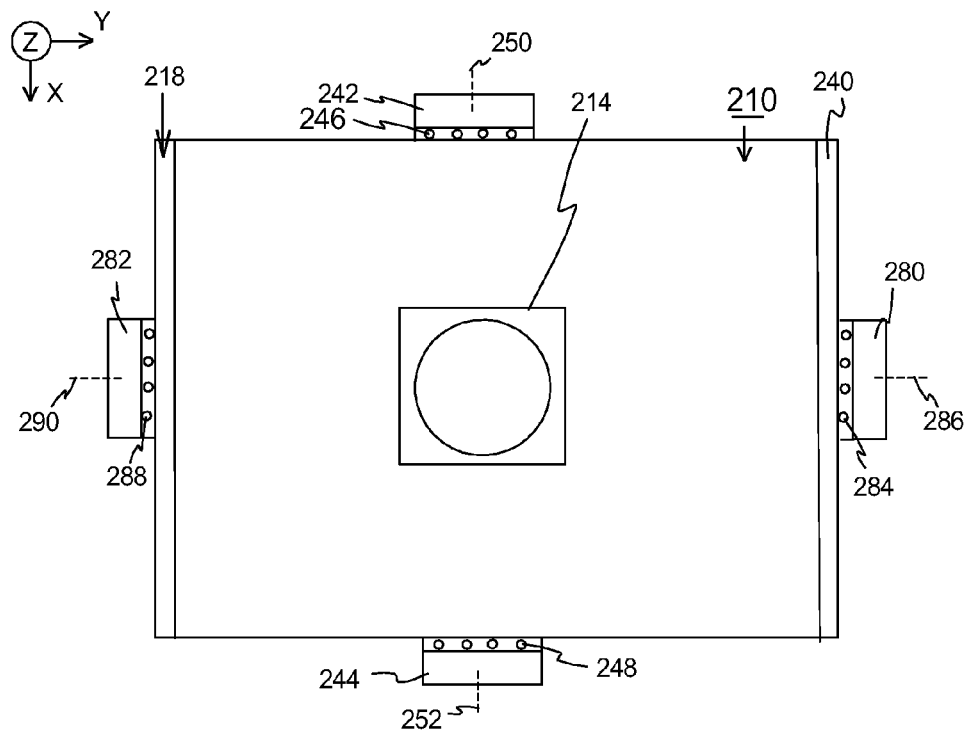
FIG. 2B is a top view of the stage assembly of FIG. 2A.

FIG. 2A is a side view and FIG. 2B is a top view of another embodiment of a stage assembly 210 having features of the present invention. In this embodiment, the stage assembly 210 is designed so that the stage 214 can be moved a relatively long travel distance along two axes, the X axis and the Y axis (e.g., for a wafer stage). It should be noted that the stage assembly 210 can be designed to move the stage 214 along the Z axis, and about the X, Y, and Z axes. In certain applications, the preferred configuration of stage mover 216 is a planar motor which can move the stage 214 with large stroke in the X and Y directions and can control three or six degrees of freedom of stage 214. In these embodiments the stage mover 216 may be either a moving magnet or moving coil planar motor, and can be used to precisely position one or more stages 214.

Further, in this embodiment, the reaction assembly 218 includes (i) a base countermass 240, (ii) a first X transverse countermass 242, (iii) a second X transverse countermass 244, (iv) a first X transverse guide 246 that guides the movement of the first X transverse countermass 242 relative to the base countermass 240 along the first X transverse axis 250 (that is transverse to the X and Z axes), (v) a second X transverse guide 248 that guides the movement of the second X transverse countermass 244 relative to the base countermass 240 along the second X transverse axis 252 (that is transverse to the X and Z axes), (vi) a first Y transverse countermass 280, (vii) a second Y transverse countermass 282, (viii) a first Y transverse guide 284 that guides the movement of the first Y transverse countermass 280 relative to the base countermass 240 along a first Y transverse axis 286 (that is transverse to the Y and Z axes), and (ix) a second Y transverse guide 288 that guides the movement of the second Y transverse countermass 282 relative to the base countermass 240 along a second Y transverse axis 290 (that is transverse to the Y and Z axes).

In this embodiment, (i) the base countermass 240, (ii) the transverse countermasses 242, 244, 280, 282, and (iii) the transverse guides 246, 248, 284, 286 are similar in the design and function to the similarly named components described above and illustrated in FIGS. 1A-1C. However, in FIGS. 2A and 2B, the base countermass 240 includes four angled sides 240A.

With the design illustrated in FIGS. 2A and 2B, the anti-torque, transverse countermasses 242, 244, 280, 282 are arranged on each side 240A of rectangular shaped base countermass 240.

In this embodiment, the theta Y (($\theta y$)) rotation about the Y axis) reaction torque (not shown) generated by the center of gravity 214A of the stage 214 being above the combined center of gravity of the reaction assembly 218 during movement of the stage 214 along the X axis is countered by the vertical components of the reaction forces on the base countermass 240 generated by accelerating the X transverse countermasses 242, 244. This action is as described in detail above with reference to FIG. 1C.

Somewhat similarly, a theta X (($\theta x$) or rotation about the X axis) reaction torque 292 generated by moving the center of gravity 214A of the stage 214 along the Y axis above the reaction assembly 218 is countered by the counter-torque 294 resulting from the vertical components of the reaction forces on the base countermass 240 generated by accelerating the Y transverse countermasses 264, 266. More specifically, in this embodiment, a stage force (not shown) applied to the stage 214 that moves the stage 214 to the right (in the first Y direction) along the Y axis without allowing any theta X rotation of the stage creates a reaction force (not shown) in the opposite second Y direction along the Y axis that is applied to the base countermass 240 at an effective height of the stage center of gravity 214A. The reaction force applied to the base countermass 240 drives the base countermass 240 to the left along the second Y direction. Further, because the center of gravity 214A of the stage 214 is above the center of gravity of the base countermass 240, the reaction torque 292 about the X axis in a first theta X direction (e.g. the counter-clockwise direction in FIG. 2A) is generated.

With the unique design provided herein, the movement of the base countermass 240 to the left creates (i) a first Y countermass force 296 (directed upward and to the left (perpendicular to the transverse axis 286)) transmitted through the transverse guide 284 to the first Y countermass 280, and (ii) a second countermass force 298 (directed downward and to the left (perpendicular to the second Y transverse axis 290)) transmitted through the second Y transverse guide 288 to the second Y countermass 282. The first Y countermass force 296 and the second countermass force 298 will create the pitching counter torque 294 in a second theta X direction (e.g. the clockwise direction in FIG. 2A) on the base countermass 40 that counters (is in the opposite direction to) the reaction torque 292 so that the net torque about the X axis is reduced.

Figure 3A:
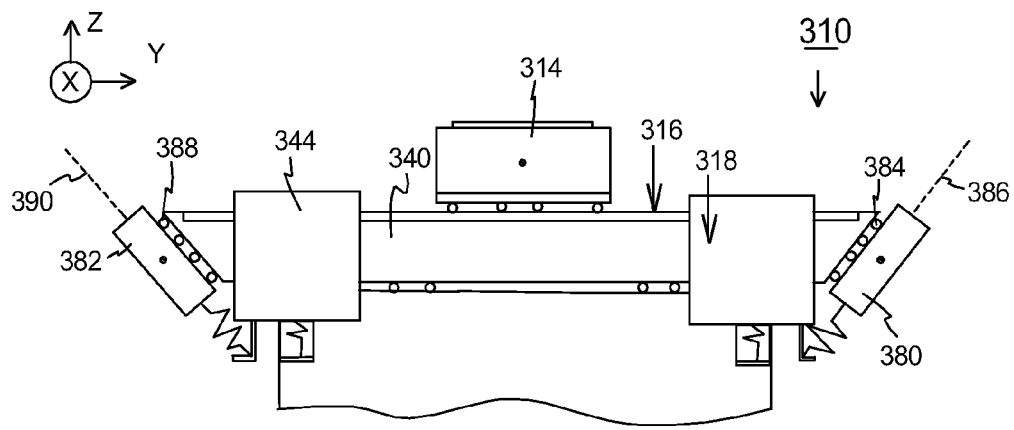
FIG. 3A is a side view of yet another embodiment of a stage assembly having features of the present invention.
Figure 3B:
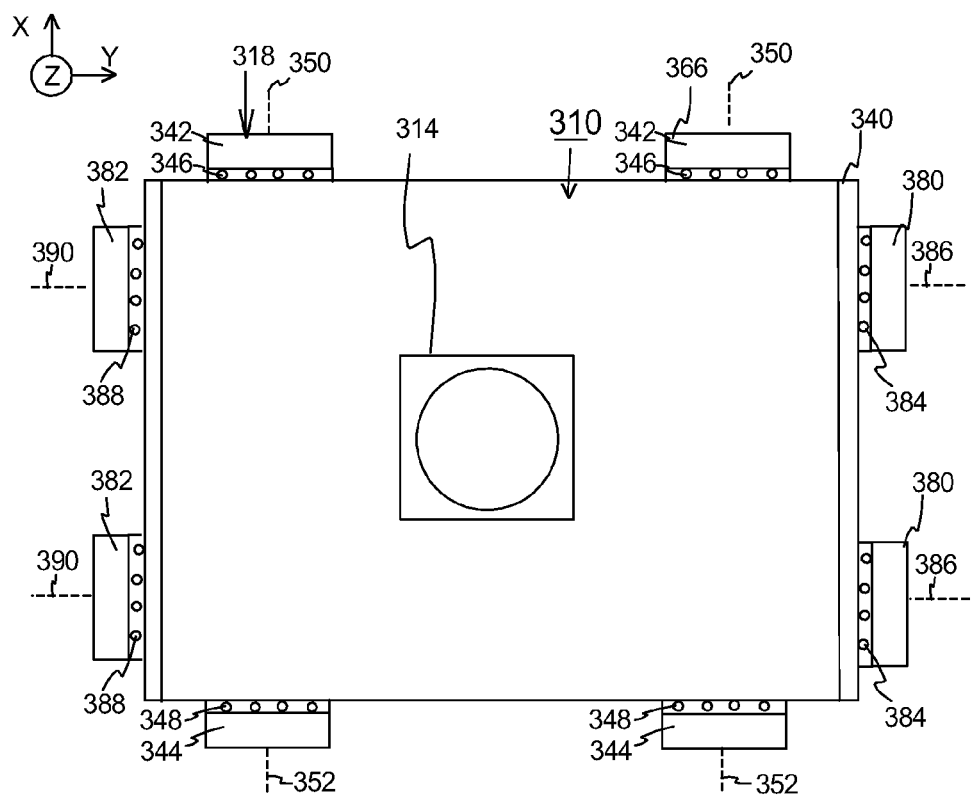
FIG. 3B is a top view of the stage assembly of FIG. 3A.

FIG. 3A is a side view and FIG. 3B is a top view of another embodiment of a stage assembly 310 having features of the present invention. In this embodiment, the stage assembly 310 is designed so that the stage 314 can be moved a relatively long travel distance along the X axis and the Y axis (e.g., a wafer stage in a microlithography apparatus). It should be noted that the stage assembly 310 can be designed to move the stage 314 along the Z axis, and about the X, Y, and Z axes.

Further, in this embodiment, the reaction assembly 318 is somewhat similar to the reaction assembly 218 described above and illustrated in FIGS. 2A and 2B. More specifically, in FIGS. 3A and 3B, the reaction assembly 318 includes (i) a base countermass 340, (ii) a pair of spaced apart (along the Y axis), first X transverse countermasses 342, (iii) a pair of spaced apart (along the Y axis), second X transverse countermasses 344, (iv) a pair of spaced apart, first X transverse guides 346 that guide the movement of the first X transverse countermasses 342 relative to the base countermass 340 along a first X transverse axis 350, (v) a pair of spaced apart, second X transverse guides 348 that guide the movement of the second X transverse countermasses 344 relative to the base countermass 340 along a second X transverse axis 352, (vi) a pair of spaced apart (along the X axis), first Y transverse countermasses 380, (vii) a pair of spaced apart (along the X axis), second Y transverse countermasses 382, (viii) a pair of spaced apart, first Y transverse guides 384 that guide the movement of the first Y transverse countermasses 364 relative to the base countermass 340 along a first Y transverse axis 386, and (ix) a pair of spaced apart, second Y transverse guides 388 that guide the movement of the second Y transverse countermasses 382 relative to the base countermass 340 along a second Y transverse axis 390.

With this design, the anti-torque countermasses 342, 344, 380, 382 are arranged on the sides of the rectangular shaped base countermass 340. Further, in this embodiment, (i) the theta X ((θx) or rotation about the X axis) torque generated by the center of gravity of the stage 314 being above the reaction assembly 318 during movement of the stage 314 along the Y axis is countered by the Y transverse countermasses 380, 382; and (ii) the theta Y ((θy) or rotation about the Y axis) torque generated by the center of gravity of the stage 314 being above the reaction assembly 318 during movement of the stage 314 along the X axis is countered by the X transverse countermasses 342, 344, in a manner similar to the description above for the embodiment of FIGS. 2A and 2B.

Stated in another fashion, in this embodiment, eight anti-torque countermasses 342, 344, 380, 382 are used, with two on each side of base countermass 340. The smaller anti-torque countermasses 342, 344, 380, 382 distributed around the base countermass 340 may be advantageous in some applications in order to avoid some structure or other subsystems.

It should be noted that rotation of the stage 314 about the Z axis (yaw movement (θz)) with the stage mover 316 will create an opposite reaction torque about the Z axis on the base countermass 340. The torque on the base countermass 340 will cause the anti-torque countermasses 342, 344, 380, 382 pairs on each side to have different motion, but the overall pitching moments will still be countered correctly. Stated in another fashion, when the base countermass 340 is rotated about the Z axis due to a reaction torque about the Z axis, the pairs of countermasses 342, 344, 380, 382 will generate a countermass moment in the opposite direction about the Z axis to counteract the reaction torque.

Figure 4:
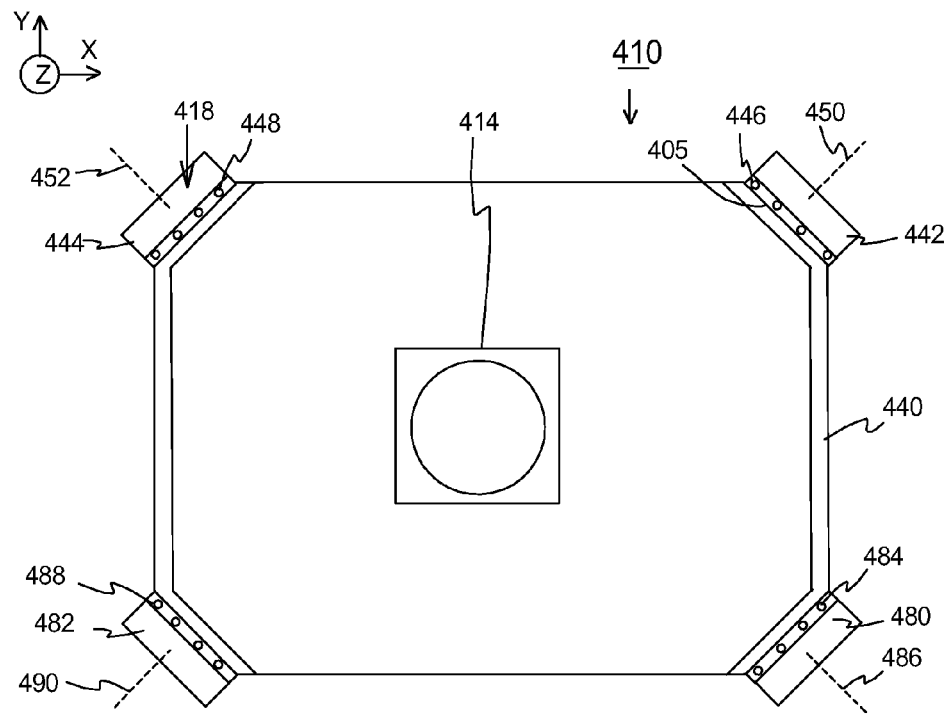
FIG. 4 is a top view of still another embodiment of a stage assembly having features of the present invention.

FIG. 4 is a top view of still another embodiment of a stage assembly 410 having features of the present invention. In this embodiment, the stage assembly 410 is designed so that the stage 414 can be moved at least a relatively long travel distance along the X axis and the Y axis (e.g., as a wafer stage in a microlithography apparatus). It should be noted that the stage assembly 410 can be designed to move the stage 414 along the Z axis, and about the X, Y, and Z axes.

Further, in this embodiment, the reaction assembly 418 is somewhat similar to the reaction assembly 218 described above and illustrated in FIGS. 2A and 2B. Further, in this embodiment, the reaction assembly 418 includes (i) a base countermass 440, (ii) a first transverse countermass 442, (iii) a second transverse countermass 444, (iv) a first transverse guide 446 that guides the movement of the first transverse countermass 442 relative to the base countermass 440 along a first transverse axis 450, (v) a second transverse guide 448 that guides the movement of the second transverse countermass 444 relative to the base countermass 440 along a second transverse axis 452, (vi) a third transverse countermass 480, (vii) a fourth transverse countermass 482, (viii) a third transverse guide 484 that guides the movement of the third transverse countermass 480 relative to the base countermass 440 along a third transverse axis 486, and (ix) a fourth transverse guide 488 that guides the movement of the fourth transverse countermass 466 relative to the base countermass 440 along a fourth transverse axis 490.

With this design, the anti-torque countermasses 442, 444, 480, 482 are arranged on the corners 405 of the base countermass 440. In this embodiment, the corners 405 of the base countermass 440 are angled relative to the X-Y plane.

In this embodiment, (i) the theta X ((θx) or rotation about the X axis) torque generated by the center of gravity of the stage 414 being above the reaction assembly 418 during movement of the stage 414 along the Y axis is countered by the transverse countermasses 442, 444 moving in the opposite vertical direction relative to base countermass 440 as transverse countermasses 480, 482; and (ii) the theta Y ((θy) or rotation about the Y axis) torque generated by the center of gravity of the stage 414 being above the reaction assembly 418 during movement of the stage 414 along the X axis is countered by the transverse countermasses 442, 480 moving in the opposite vertical direction relative to the base countermass 440 as transverse countermasses 444, 482.

Figure 5:
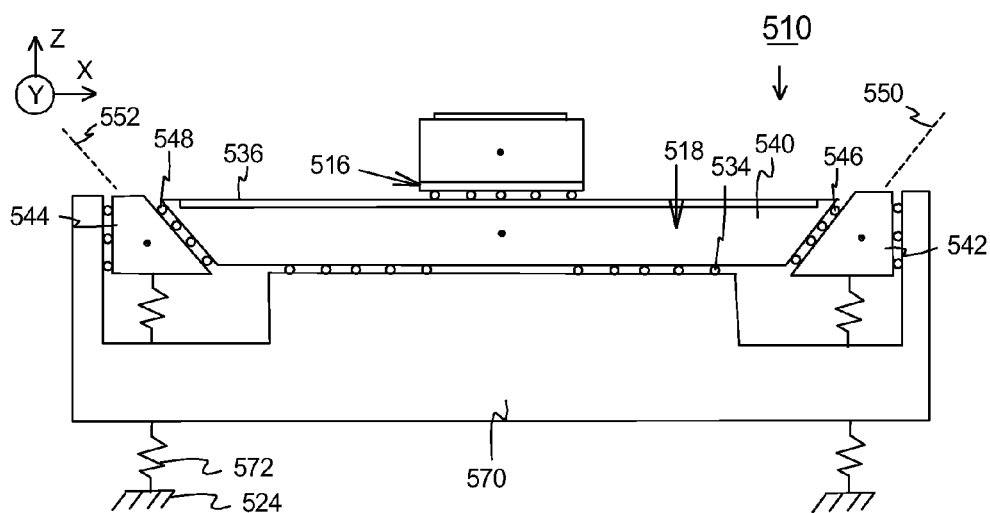
FIG. 5 is a side view of yet another embodiment of a stage assembly having features of the present invention.

FIG. 5 is a side view of yet another embodiment of a stage assembly 510 having features of the present invention. In this embodiment, the reaction assembly 518 includes (i) an upper base countermass 540, (ii) a lower base countermass 570 that supports the upper base countermass 540 with a bearing 534 (e.g. a fluid bearing for example), (iii) a first transverse countermass 542, (iv) a second transverse countermass 544, (v) a pair of first transverse guides 546 that guide the movement of the first transverse countermass 542 relative to the base countermasses 540, 570 along a first transverse axis 550, and (vi) a pair of second transverse guides 548 that guide the movement of the second transverse countermass 544 relative to the base countermasses 540, 570 along a second transverse axis 552. In this embodiment, each transverse (anti-torque) countermass 542, 544 is guided relative to and connected to each base countermass 540, 570.

Because of the constraints, in reaction to motion of the stage(s), the upper base countermass 540 moves more than the lower base countermass 570. In this design, the upper base countermass 540 can be supported and even over-constrained by the fluid bearing 534 between it and lower base countermass 570. This can help reduce the required structural stiffness of the upper base countermass 540 and the reaction component 536 of the stage mover 516.

Additionally, the reaction assembly 518 can have compliant Z support 572 for vibration isolation and to support the bottom base countermass 570 along the Z axis relative to a mounting base 524. For example, each support 572 can be an isolator that includes a pneumatic cylinder (not shown) and an actuator (not shown). Alternatively, for example, the reaction assembly 518 can be supported by a fluid bearing relative to the mounting base 524 that allows for motion of the bottom base countermass 570 in the planar degrees of freedom.

It should be noted that the embodiment illustrated in FIG. 5 can modified to include one or more transverse countermasses on each side or a transverse countermass on each corner of the upper base countermass 540.

In the embodiments provided herein, the anti-torque countermasses are passively driven by the base (main) countermass, so big actuators are not necessary. Only trim motors producing moderate correction forces may be needed.

FIG. 6 is a schematic view illustrating an exposure apparatus 630 useful with the present invention. The exposure apparatus 630 includes the apparatus frame 680, an illumination system 682 (irradiation apparatus), a reticle stage assembly 684, an optical assembly 686 (lens assembly), and a wafer stage assembly 610. The stage assemblies provided herein can be used as the wafer stage assembly 610. Alternately, with the disclosure provided herein, the stage assemblies provided herein can be modified for use as the reticle stage assembly 684.

The exposure apparatus 630 is particularly useful as a lithographic device that transfers a pattern (not shown) of an integrated circuit from the reticle 688 onto the semiconductor wafer 690. The exposure apparatus 630 mounts to the mounting base 624, e.g., the ground, a base, or floor or some other supporting structure.

The apparatus frame 680 is rigid and supports the components of the exposure apparatus 630. The design of the apparatus frame 680 can be varied to suit the design requirements for the rest of the exposure apparatus 630.

The illumination system 682 includes an illumination source 692 and an illumination optical assembly 694. The illumination source 692 emits a beam (irradiation) of light energy. The illumination optical assembly 694 guides the beam of light energy from the illumination source 692 to the optical assembly 686. The beam illuminates selectively different portions of the reticle 688 and exposes the semiconductor wafer 690. In FIG. 6, the illumination source 692 is illustrated as being supported above the reticle stage assembly 684. Alternatively, the illumination source 692 can be secured to one of the sides of the apparatus frame 680 and the energy beam from the illumination source 692 is directed to above the reticle stage assembly 684 with the illumination optical assembly 694.

The optical assembly 686 projects and/or focuses the light passing through the reticle to the wafer. Depending upon the design of the exposure apparatus 630, the optical assembly 686 can magnify or reduce the image illuminated on the reticle.

The reticle stage assembly 684 holds and positions the reticle 688 relative to the optical assembly 686 and the wafer 690. Similarly, the wafer stage assembly 610 holds and positions the wafer 690 with respect to the projected image of the illuminated portions of the reticle 688.

There are a number of different types of lithographic devices. For example, the exposure apparatus 630 can be used as scanning type photolithography system that exposes the pattern from the reticle 688 onto the wafer 690 with the reticle 688 and the wafer 690 moving synchronously. Alternatively, the exposure apparatus 630 can be a step-and-repeat type photolithography system that exposes the reticle 688 while the reticle 688 and the wafer 690 are stationary.

However, the use of the exposure apparatus 630 and the stage assemblies provided herein are not limited to a photolithography system for semiconductor manufacturing. The exposure apparatus 630, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, machine tools, metal cutting machines, inspection machines and disk drives.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 7A:
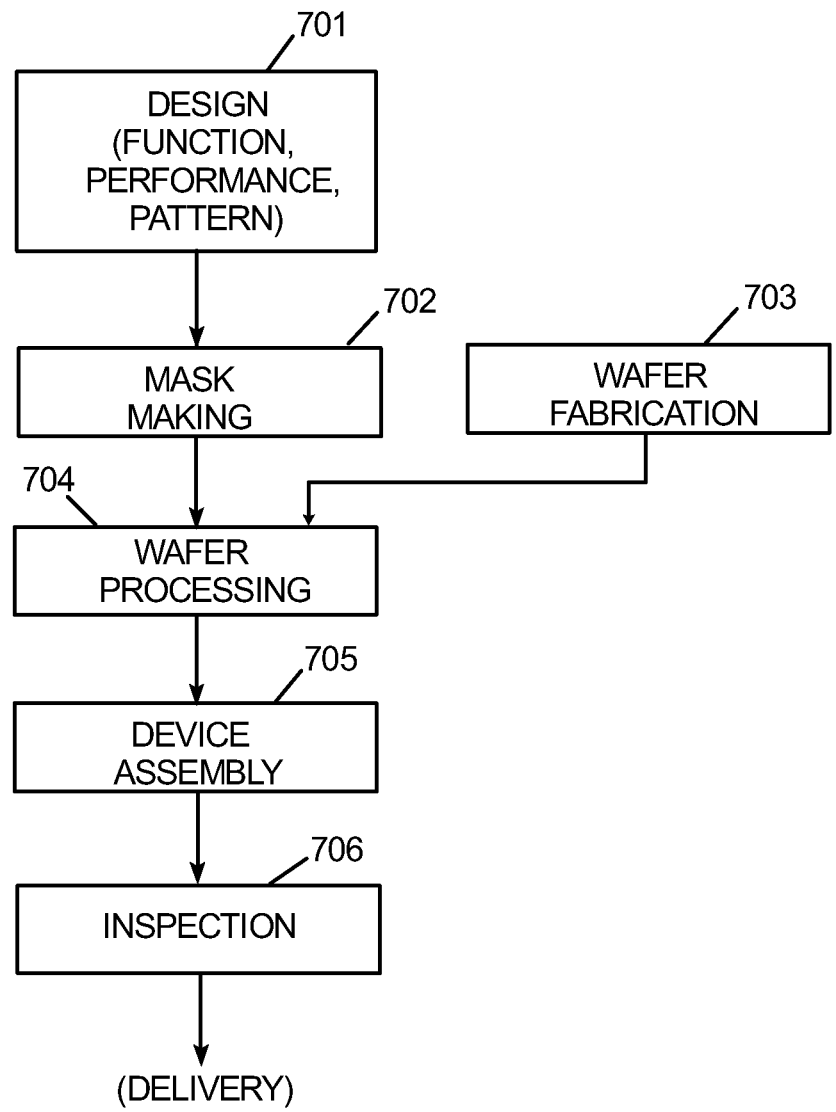
FIG. 7A is a flow chart that outlines a process for manufacturing a device in accordance with the present invention.

Further, semiconductor devices can be fabricated using the above described systems, by the process shown generally in FIG. 7A. In step 701 the device's function and performance characteristics are designed. Next, in step 702, a mask (reticle) having a pattern is designed according to the previous designing step, and in a parallel step 703 a wafer is made from a silicon material. The mask pattern designed in step 702 is exposed onto the wafer from step 703 in step 704 by a photolithography system described hereinabove in accordance with the present invention. In step 705 the semiconductor device is assembled (including the dicing process, bonding process and packaging process), finally, the device is then inspected in step 706.

Figure 7B:
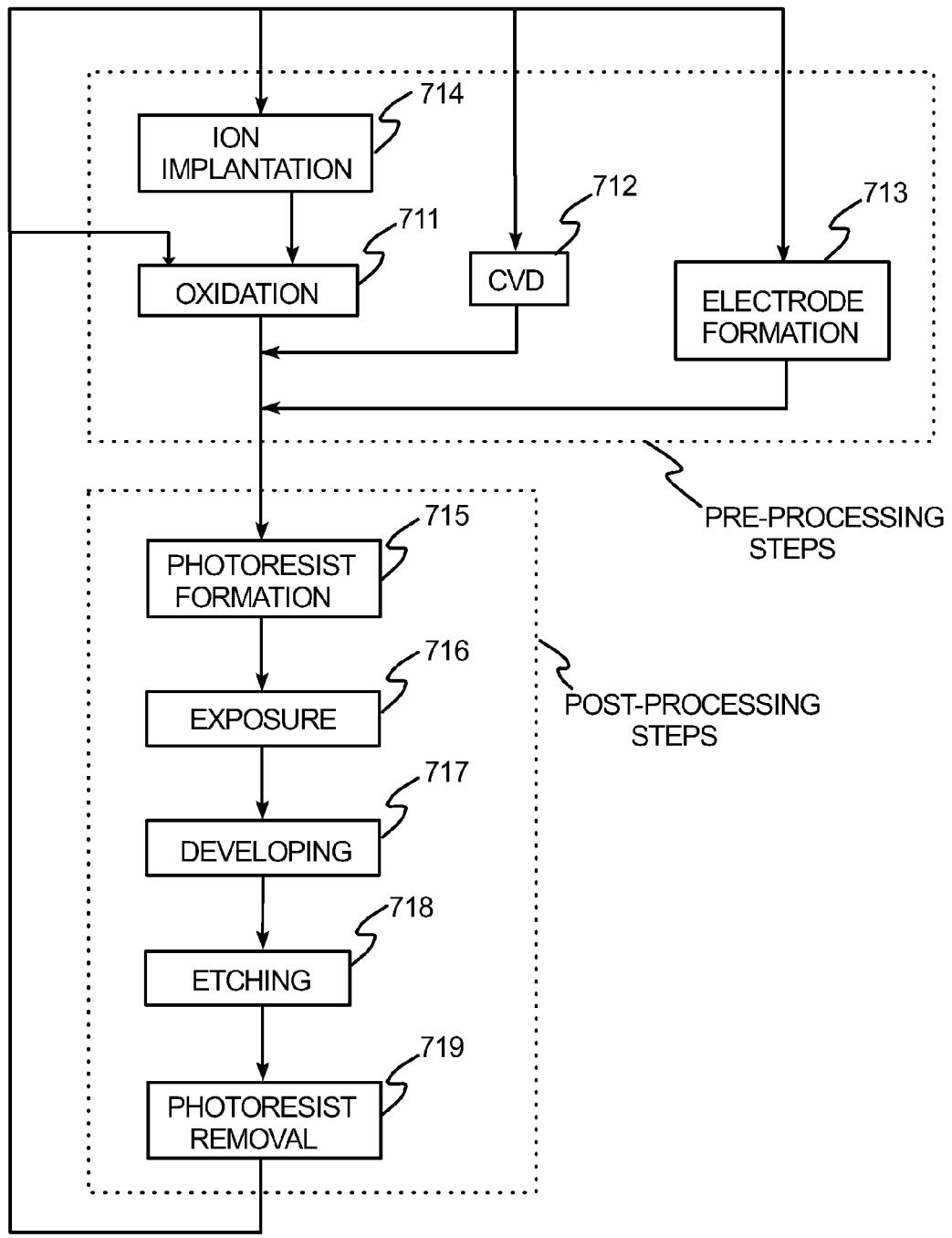
FIG. 7B is a flow chart that outlines device processing in more detail.

FIG. 7B illustrates a detailed flowchart example of the above-mentioned step 704 in the case of fabricating semiconductor devices. In FIG. 7B, in step 711 (oxidation step), the wafer surface is oxidized. In step 712 (CVD step), an insulation film is formed on the wafer surface. In step 713 (electrode formation step), electrodes are formed on the wafer by vapor deposition. In step 714 (ion implantation step), ions are implanted in the wafer. The above mentioned steps 711-714 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 715 (photoresist formation step), photoresist is applied to a wafer. Next, in step 716 (exposure step), the above-mentioned exposure device is used to transfer the circuit pattern of a mask (reticle) to a wafer. Then in step 717 (developing step), the exposed wafer is developed, and in step 718 (etching step), parts other than residual photoresist (exposed material surface) are removed by etching. In step 719 (photoresist removal step), unnecessary photoresist remaining after etching is removed.

Multiple circuit patterns are formed by repetition of these preprocessing and post-processing steps.

While the particular stage assembly as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A stage assembly that moves a device along a first axis, the stage assembly comprising:
   a stage that retains the device, the stage including a stage center of gravity;
   a stage mover that moves the stage along the first axis, the stage mover including a moving component that is coupled to the stage and a reaction component; and
   a reaction assembly having a reaction assembly center of gravity that is spaced apart from the stage center of gravity along a second axis that is perpendicular to the first axis, the reaction assembly including (i) a base countermass that is guided to allow for movement along the first axis, the base countermass being coupled to the reaction component so that reaction forces from the stage mover are transferred to the base countermass to move the base countermass along the first axis, and (ii) a first transverse countermass that is guided to allow for movement relative to the base countermass along a first transverse axis that has components along both the first and second axes, the first transverse countermass being coupled to the base countermass so that movement of the base countermass along the first axis causes the first transverse countermass to move along the first transverse axis and reduce the reaction moments on the reaction assembly about a third axis that is perpendicular to the first axis and the second axis.

2. The stage assembly of claim 1 wherein the stage mover moves the stage along the third axis, and wherein the reaction assembly further comprises a second transverse countermass that is guided to allow for movement along a second transverse axis that has components along both the second and third axes, the second transverse countermass being coupled to the base countermass so that movement of the base countermass along the third axis causes the second transverse countermass to move along the second transverse axis, wherein motion of the second transverse countermass reduces the reaction moments on the reaction assembly about the first axis.

3. The stage assembly of claim 2 wherein when the stage mover moves the stage in a first direction along the first axis, the base countermass moves in a second direction that is opposite to the first direction along the first axis; and wherein movement of the base countermass in the second direction along the first axis causes the first transverse mass to move along the first transverse axis; and wherein when the stage mover moves the stage in a first direction along the third axis, the base countermass moves in a second direction that is opposite to the first direction along the third axis; and wherein movement of the base countermass in the second direction along the third axis causes the second transverse mass to move along the second transverse axis.

4. The stage assembly of claim 1 further comprising a second transverse countermass that is guided to allow for movement relative to the base countermass along a second transverse axis that has components along both the first and second axes, the second transverse countermass being coupled to the base countermass so that movement of the base countermass along the first axis causes the second transverse countermass to move along the second transverse axis and reduce the reaction moments on the reaction assembly about the third axis.

5. The stage assembly of claim 4 wherein the motion of the two transverse countermasses creates a counter-torque that reduces the reaction torque acting on the reaction assembly.

6. The reaction assembly of claim 4 wherein the stage mover moves the stage along the third axis, and wherein the reaction assembly further comprises a third transverse countermass that is guided to allow for movement along a third transverse axis that has components along both the second and third axes, the third transverse countermass being coupled to the base countermass so that movement of the base countermass along the third axis causes the third transverse countermass to move along the third transverse axis, wherein motion of the third transverse countermass reduces the reaction moments on the reaction assembly about the first axis.

7. The reaction assembly of claim 6 wherein the reaction assembly further comprising a fourth transverse countermass that is guided to allow for movement along a fourth transverse axis that has components along both the second and third axes, the fourth transverse countermass being coupled to the base countermass so that movement of the base countermass along the third axis causes the fourth transverse countermass to move along the fourth transverse axis, wherein motion of the fourth transverse countermass reduces the reaction moments on the reaction assembly about the first axis.

8. The reaction assembly of claim 7 wherein motion of the first and second countermasses creates a counter-torque to reduce or cancel reaction torque acting on the reaction assembly about the third axis, and wherein motion of the third and fourth countermasses creates a counter-torque to reduce or cancel reaction torque acting on the reaction assembly about the first axis.

9. The stage assembly of claim 1 further comprising a low stiffness support to support the first transverse countermass against gravity.

10. The stage assembly of claim 1 wherein when the stage mover moves the stage in a first direction along the first axis, the base countermass moves in a second direction that is opposite to the first direction along the first axis; and wherein movement of the base countermass in the second direction along the first axis causes the first transverse mass to move in a first transverse direction with a component parallel to the second axis.

11. The stage assembly of claim 1 further comprising a stage base that supports the base countermass and a reaction bearing that allows the base countermass to move relative to the stage base along the first axis.

12. An exposure apparatus comprising an illumination system and the stage assembly of claim 1.

13. A process for manufacturing a device that includes the steps of providing a substrate and forming an image on the substrate with the exposure apparatus of claim 12.

14. A stage assembly that moves a device along a first axis, the stage assembly comprising:
a stage that retains the device, the stage including a stage center of gravity;
a stage mover that moves the stage along the first axis, the stage mover including a moving component that is coupled to the stage and a reaction component;
a base countermass that is guided to allow for movement along the first axis, the base countermass being coupled to the reaction component so that reaction forces from the stage mover are transferred to the base countermass to move the base countermass along the first axis, wherein the reaction forces on the base countermass also create a reaction torque on the base countermass; and
a first transverse countermass that is guided to allow for movement along a first transverse axis that is transverse to the first axis, the first transverse countermass being coupled to the base countermass so that movement of the base countermass along the first axis causes the first transverse countermass to move along the first transverse axis and causes a countermass moment to be imparted on the base countermass that reduces the reaction torque.

15. The stage assembly of claim 14 further comprising a linear guide that guides the movement of the first transverse countermass relative to the base countermass so that movement of the base countermass along the first axis passively drives the first transverse countermass.

16. The stage assembly of claim 14 further comprising a second transverse countermass that is guided to allow for movement along a second transverse axis that is transverse to the first axis, the second transverse countermass being coupled to the base countermass so that movement of the base countermass along the first axis causes the second transverse countermass to move along the second transverse axis.

17. The stage assembly of claim 16 further comprising a third transverse countermass that is guided to allow for movement along a third transverse axis that is transverse to the first axis, the third transverse countermass being coupled to the base countermass so that movement of the base countermass along a second axis that is perpendicular to the first axis causes the third transverse countermass to move along the third transverse axis.

18. The stage assembly of claim 17 wherein when the stage mover moves the stage in the second direction along the first axis, the base countermass moves in the first direction along the first axis; and wherein movement of the base countermass in the first direction along the first axis causes the first transverse mass to move in a second transverse direction along the first transverse axis.

19. The stage assembly of claim 14 further comprising a stage base that supports the base countermass and a reaction bearing that allows the base countermass to move relative to the stage base along the first axis.

20. An exposure apparatus comprising an illumination system and the stage assembly of claim 14.

21. A process for manufacturing a device that includes the steps of providing a substrate and forming an image on the substrate with the exposure apparatus of claim 20.

22. A method for inhibiting the transfer of reaction forces from a stage mover that moves a stage along a first axis, the stage having a stage center of gravity, the stage mover including a moving component that is coupled to the stage and a reaction component, the method comprising the steps of:

coupling the reaction component to a base countermass so that reaction forces from the stage mover are transferred to the base countermass to move the base countermass along the first axis, the base countermass being guided to allow for movement along the first axis, the base countermass having a base center of gravity that is spaced apart from the stage center of gravity along a second axis that is perpendicular to the first axis; and coupling a first transverse countermass to the base countermass, the first transverse countermass being guided to allow for movement along a first transverse axis that is transverse to the first axis relative to the base countermass, wherein movement of the base countermass along the first axis causes the first transverse countermass to move along the first transverse axis to reduce reaction moments on the base countermass about a third axis that is perpendicular to the first axis and the second axis.

23. The method of claim 22 further comprising the step of coupling a second transverse countermass to the base countermass, the second transverse countermass being guided to allow for movement along a second transverse axis that is transverse to the first axis, wherein movement of the base countermass along the first axis causes the second transverse countermass to move along the second transverse axis to reduce reaction moments on the base countermass about the third axis.

24. The method of claim 22 further comprising the step of coupling a second transverse countermass to the base countermass, the second transverse countermass being guided to allow for movement along a second transverse axis that is transverse to the first axis, wherein movement of the base countermass along the third axis causes the second transverse countermass to move along the second transverse axis to reduce reaction moments on the base countermass about the first axis.

* * * * *